United States Patent [19]
Suzuki et al.

[11] Patent Number: 6,107,804
[45] Date of Patent: Aug. 22, 2000

[54] APPARATUS FOR MEASURING THE AMOUNT OF ELECTRIC CHARGE INDUCED IN CONDUCTIVE PART AND METHOD OF MEASURING ELECTRIC CHARGE

[75] Inventors: Kouichi Suzuki, Tokyo; Youko Yaguchi; Juniti Yamaguchi, both of Yamagata, all of Japan

[73] Assignee: NEC Corporation, Tokyo, Japan

[21] Appl. No.: 09/038,354

[22] Filed: Mar. 10, 1998

Related U.S. Application Data

[62] Division of application No. 08/454,851, May 31, 1995.

[30] Foreign Application Priority Data

May 31, 1994 [JP] Japan ................................ 6-119115

[51] Int. Cl.$^7$ .................................................. G01R 29/12
[52] U.S. Cl. ............................................................ 324/457
[58] Field of Search ................................... 324/457, 458, 324/452, 455, 72.5, 158.1, 51, 122

[56] References Cited

U.S. PATENT DOCUMENTS

| | | | |
|---|---|---|---|
| 2,883,619 | 4/1959 | Kobbe et al. | 324/72.5 |
| 3,443,224 | 5/1969 | Kramer et al. | 324/72.5 |
| 4,139,813 | 2/1979 | Shaffer | 324/32 |
| 4,591,794 | 5/1989 | Shattuck et al. | 324/464 |
| 5,151,659 | 9/1992 | Tanaka et al. | 324/458 |
| 5,164,674 | 11/1992 | Bakhoum | 324/509 |
| 5,300,889 | 4/1994 | Bakhoum | 324/457 |

FOREIGN PATENT DOCUMENTS

| | | |
|---|---|---|
| 53-116182 | 10/1978 | Japan . |
| 58-33577 | 7/1983 | Japan . |
| 281069 | 11/1988 | Japan . |
| 1283672 | 1/1987 | Russian Federation . |

OTHER PUBLICATIONS

IEEE Trans. of Power Delivery, vol. 3, No. 1, Jan. 1988, New York, US, pp. 165–172, XP002027566, H. Ootera et al. "analytic method for everlasting surface charge distribution" p. 166, right hand column.

*Primary Examiner*—Josie Ballato
*Assistant Examiner*—T. R. Sundaram

[57] ABSTRACT

A measuring apparatus has a capacitor incorporated in a handy measuring tool electrically connected to a voltage meter, and a sharp leading end of the capacitor is brought into contact with a lead of a large scale integrated circuit device for accumulating movable electric charge induced in the presence of a charged insulating package into the capacitor so that the amount of the accumulated movable electric charge is calculated from a potential difference produced between electrodes of the capacitor.

5 Claims, 14 Drawing Sheets

APPARATUS FOR MEASURING THE AMOUNT OF ELECTRIC CHARGE INDUCED IN CONDUCTIVE PART AND METHOD OF MEASURING ELECTRIC CHARGE

This is a division of application Ser. No. 08/454,851, filed May 31, 1995 pending.

FIELD OF THE INVENTION

This invention relates to an electric-charge measuring technology and, more particularly, to an electric-charge measuring apparatus and a method of measuring electric charge available for measuring the amount of electric charge inducted into a conductive part of a composite body due to a charged insulating part of the composite body.

DESCRIPTION OF THE RELATED ART

A conductive lead and an insulating package are incorporated in a large scale integrated circuit device, and the large scale integrated circuit device is a typical example of the composite body. The circuit components per chip have been progressively increased, and, accordingly, the circuit components of the large scale integrated circuit device have been miniaturized. Even a large scale integrated circuit device for a home electric application has circuit components designed under a sub-micron rule and insulating layers and diffused regions less in thickness and depth than 1 micron. For this reason, the miniature circuit components are liable to be damaged by electric field.

Another reason for a low withstand voltage of the large scale integrated circuit device is a thin large insulating package less in thickness than 1 millimeter. The thin large insulating package has a large electrostatic capacity, and, accordingly, accumulates a large amount of electric charge.

Thus, the electrostatic circumstances are serious to the large scale integrated circuit device, and a protection technology against the electrostatic charge is important for the manufacturer of the large scale integrated circuit devices.

The destruction cue to the electrostatic charge is considered to take place as follows. When the lead is charged, the electrostatic energy is supplied to the circuit components of the large scale integrated circuit device, and generates strong electric field. The electrostatic energy and the strong electrostatic field damage the circuit components and insulating layers providing isolation between the circuit components. In the electrostatic destruction process, a charging phenomenon of the insulating package is an important step, and it is considered that the electrostatic destruction is resulted from one of the following phenomena in and after the fabrication of the large scale integrated circuit device.

An electrostatic destruction originates in an electric discharge such as a spark discharge or a contact discharge from an external electrostatic source to the leads of the large scale integrated circuit device. A television receiver, a display unit equipped with cathoderay tube and a human body/insulating bodies frictionally electrified serve as the external electrostatic source. The frictionally electrified insulating bodies are found around the large scale integrated circuit device in and after the fabrication process, and a jig such as a plastic magazine, mounting parts such as a printed wiring board and an IC socket and another large scale integrated circuit device sealed in a resin or ceramics are examples of the frictionally electrified insulating body. The electrostatic destruction due to the electric discharge from the external electrostatic source is hereinbelow referred to as "electrostatic destruction" due to the first origin.

Another electrostatic destruction originates in an electric discharge from the leads of the large scale integrated circuit device to the ground. The charge are inducted in the leads due to the charged insulating package of the large scale integrated circuit device. Electrostatic energy is supplied to the integrated circuit, or strong electric field is created, thereby causing the electric discharge to take place. In this case, the electric discharge is also the corona discharge or the contact discharge, and a relative relation between the ground and the insulating package and the amount of electrostatic charge have strong influences on the electric discharge. The insulating package is charged through the above described phenomenon or another unavoidable handling during the fabrication work or the mounting work. The electrostatic destruction due to the electric discharge to the ground is hereinbelow referred to as "electrostatic destruction due to the second origin".

Even through the amount of the electrostatic charge is large enough to destroy a micro-structure in the large scale integrated circuit device, a discharging path with a large time constant does not allow the electrostatic destruction take place, because thermo-energy and electrostatic charge are not concentrated under the large time constant. However, a large amount of electrostatic charge is left in the large scale integrated circuit device. The remaining electric charge destroys the microstructure under a short time constant due to concentration of the electrostatic charge and the thermo-energy.

In the assembling work and the inspection work of the fabrication process, the large scale integrated circuit devices are conveyed from a station to the next station by using a vacuum pincette and sliding along long rails. The friction with the air or the long rails charges the insulating packages. Dry air is blown to the large scale integrated circuit device in a low temperature characteristic test so as to prevent the large scale integrated circuit device from a dew condensation, and the friction with the dry air results in the charged packages. While the large scale integrated circuit devices are stored in a magazine, the insulating packages tend to be charged due to the friction with the magazine.

Thus, the large scale integrated circuit devices are exposed to the charging circumstances in the fabrication process.

In order to prevent the large scale integrated circuit device from the first origin, the manufacturer have tried various counter-actions such as a built-in protective circuit, a charge eliminator for workers and an ionizer, and these counter-actions are fairly effective against the electrostatic destruction due to the first origin.

As to a counter-action against the electrostatic destruction due to the second origin, the manufacturer are seeking to find an effective counter-action. In the research and development efforts to find an effective counter-action, it is necessary to exactly measure the amount of electrostatic charge resulting in the destruction of the micro-structure of the large scale integrated circuit device.

However, the present inventors have not found an effective measuring method of the amount of electric charge and a measuring apparatus available for a large scale integrated circuit device, and the manufacturer presently uses a general-purpose measuring apparatus such as a Faraday cage.

FIG. 1 illustrates an typical example of the Faraday cage, and the Faraday cage comprises an inner cylindrical vessel 1 of conductive metal, an outer cylindrical vessel 2 of the conductive metal grounded and concentrical with the inner cylindrical vessel, a cylindrical dielectric layer 3 provided between the inner cylindrical vessel 1 and the outer cylindrical vessel 2 and a voltage meter 4 coupled between the inner cylindrical vessel 1 and the outer cylindrical vessel 2, and the cylindrical dielectric layer 3 has a capacitance C.

A large scale integrated circuit device 4 is put on the inner cylindrical vessel, and a potential difference V is generated between the inner cylindrical vessel 1 and the outer cylindrical vessel 2 through an electrostatic induction. The potential difference V is measured by the volt meter 4, and the amount Q of electric charge originally accumulated in the large scale integrated circuit device 5 is calculated by using the following equation.

$$Q = C \times V \qquad \text{Equation 1}$$

The measuring principle of the Faraday cage is based on the Gauss'theorem, and the electrostatic charge dispersed on the surface of the insulating package is measured through the principle. However, the Faraday cage ignores whether or not conductive leads are incorporated in the package.

The following drawbacks are inherent in the Faraday cage. First, the amount of electric charge Q is not measured in original circumstances. Second, the inner cylindrical vessel 1 sets a limit on the volume of the sample 5. Third, the amount of electric charges is liable to be varied due to a contact or a friction. These drawbacks are resulted from the accommodation of the sample 5 into the inner cylindrical vessel 1.

Another measuring apparatus is disclosed in Japanese Patent Publication of Unexamined Application No. 53-116182, and FIG. 2 illustrates the measuring apparatus disclosed in the Japanese Patent Publication of Unexamined Application.

The measuring apparatus comprises a self-discharge type charge eliminator 5, a capacitor 7 electrically connected between the self-discharge type charge eliminator 5 and the ground and a volt meter 8 coupled between the accumulating electrode and the counter electrode of the capacitor 7. The capacitance C of the capacitor is known.

When an operator measures the amount of electric charge Q1 of a sample 9, the sell-discharge charge eliminator 6 is caused to induct electrostatic charge from the sample 9, and a potential difference V is measured with the volt meter 8. The amount of electric charge Q1 is also calculated by using Equation 1. The electric charge to be measured is also accumulated in the surface of the insulating package of the large scale integrated circuit device.

The disclosed measuring apparatus is free from the drawbacks inherent in the Faraday cage, and is available for the large scale integrated circuit device. However, both of the Faraday cage and the disclosed measuring apparatus measure the total amount of electric charge accumulated in the surface of the insulating package, and can not measure a capacitance coupled between each of the leads and the ground. As discussed hereinbefore, the electrostatic destruction originates in the electric discharge between the external electrostatic source and each of the leads or between each of the leads and the ground, and the manufacturer wants a measuring apparatus capable of measuring the amount of electric charge for the individual leads.

SUMMARY OF THE INVENTION

It is therefore an important object of the present invention to provide a measuring technology which measures the amount of electric charge induced in a conductive part associated with a charged insulating part.

To accomplish the object, the present invention proposes to measure a variation of potential level due to a movable electric charge.

In accordance with one aspect of the present invention, there is provided a measuring apparatus used for a sample placing at a place close to a source of a ground voltage and including a charged insulating part and a conductive part having a fixed electric charge and a movable electric charge opposite in polarity to the fixed electric charge, both of the fixed electric charge and the movable electric charge being induced in the conductive part in the presence of the charged insulating part, comprising: a probe member allowing the movable electric charge to flow thereinto; an accumulating means electrically connected to the probe member, and converting the movable electric charge to a potential level; and an electric measuring unit electrically connected to the accumulating means, and measuring the potential level for determining the amount of the movable electric charge.

In accordance with another aspect of the present invention, there is provided a method of measuring the amount of an electric charge, comprising the steps of: preparing a sample including a charged insulating part and a conductive part having a fixed electric charge and a movable electric charge opposite in polarity to the fixed electric charge, both of the fixed electric charge and the movable electric charge being induced in the conductive part in the presence of the charged insulating part; accumulating the movable electric charge into a capacitor unit for changing a potential level from an initial value to a final value; measuring a difference between the initial value and the final value; and calculating the amount of the movable electric charge on the basis of a capacitance of the capacitor unit and the difference.

BRIEF DESCRIPTION OF THE DRAWINGS

The features and advantages of the measuring apparatus and the method of measuring the amount of electric charge according to the present invention will be more clearly understood from the following description taken in conjunction with the accompanying drawings in which.

PRINCIPLE OF MEASUREMENT

Figure 1:
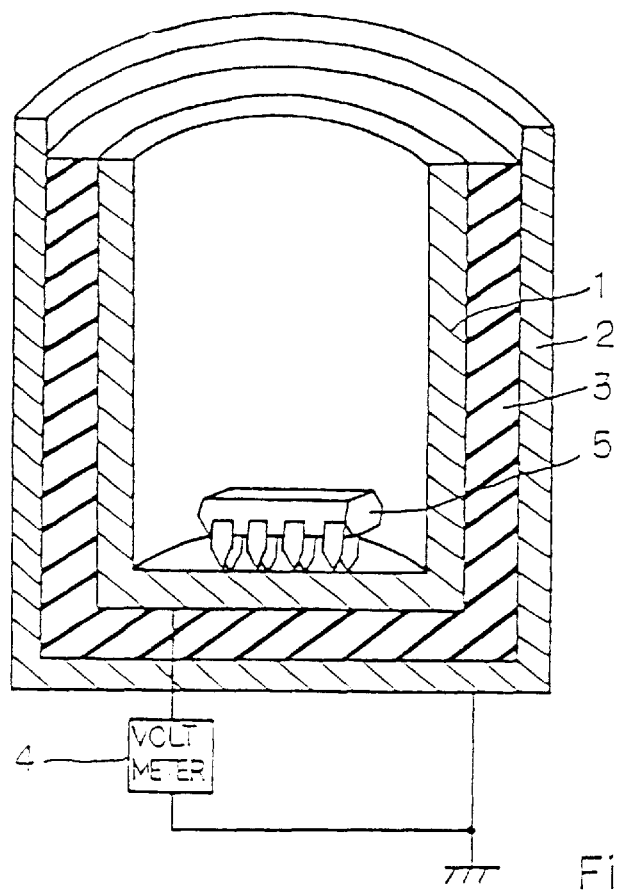
FIG. 1 is a cross sectional perspective view showing the prior art Faraday cage for measuring the amount of electric charge.
Figure 2:
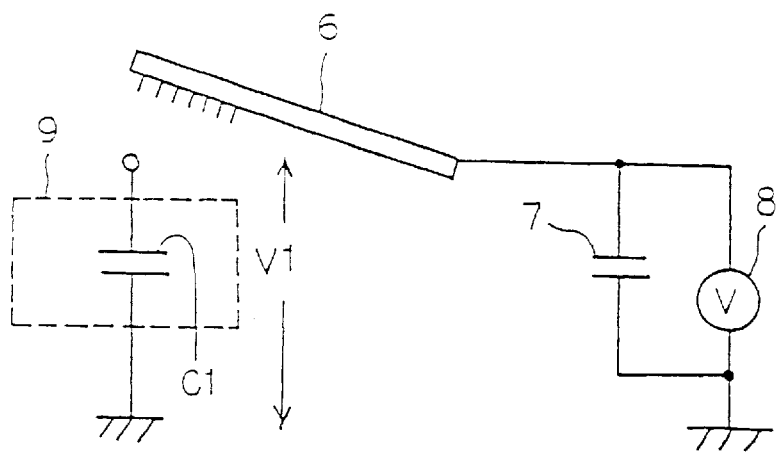
FIG. 2 is schematic view showing the prior art measuring apparatus disclosed in the Japanese Patent Publication of Unexamined Application.
Figure 3A:
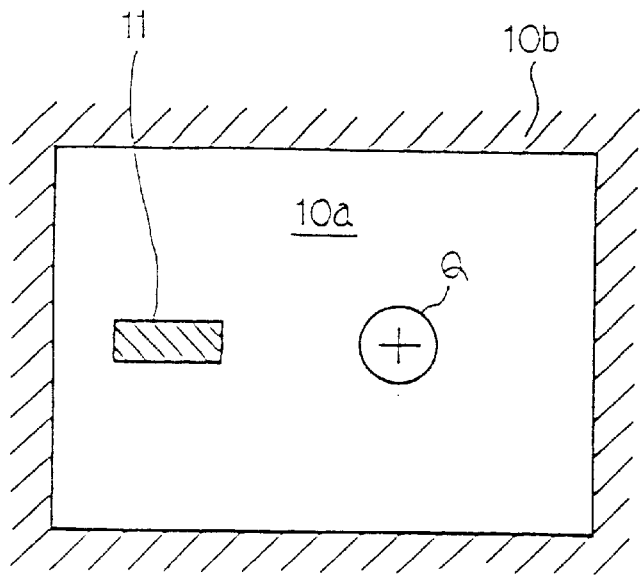
FIGS. 3A and 3B are schematic views showing a movable charge.
Figure 3B:
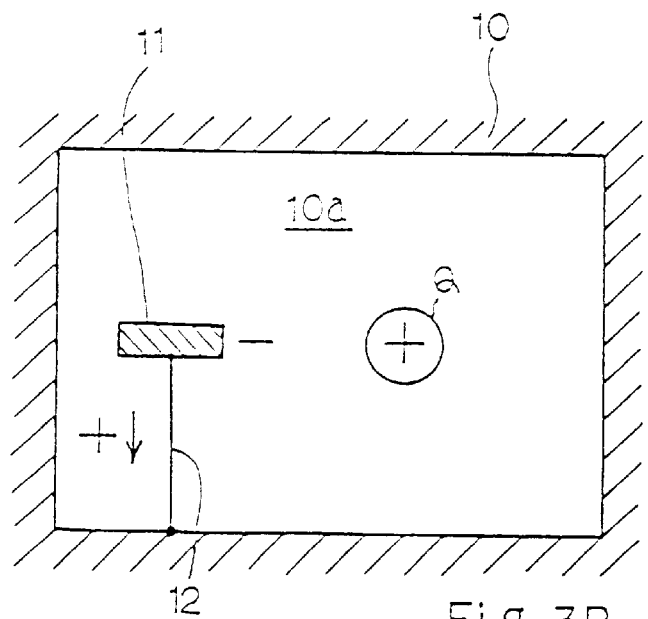

First, a concept of movable electric charge is described hereinbelow. When a positive electric charge Q is placed in a space 10a encircled by a conductive wall 10b coupled to the ground, an electric field is created in the space 10a, and the potential level at an arbitrary point in the space 10a is determined by the amount of the positive electric charge Q, the dielectric constant of a substance filling the space 10a and the distance from the positive electric charge Q and the conductive wall 10b.

If a metal piece 11 is put into the space 10a, the metal piece 11 is equal in potential level to the point in the space 10a.

Subsequently, when the metal piece 11 is connected through a conductive lead 12 to the conductive wall 10, the positive electric charge flows out from the metal piece 11 to the grounded conductive wall 10 so as to decrease the potential level at the conductive lead 12 and the metal piece to zero, and the negative electric charge remains in the metal piece. The phenomenon is explainable such that a negative electric charge flows from the grounded conductive wall 10b. However, if both expressions are mixed, it is confusing, and only the expression "flow-out" is hereinbelow used in the following description. The present inventors define the flow-out charge as "movable charge".

The amount of movable charge is depending upon the electric field after the contact of the metal piece 11 to the grounded conductive wall 10b, and equal to the amount of negative electric charge for decreasing the potential level of the metal piece 11 to zero.

Thus, the amount of movable charge is dominated by the point of the positive electric charge Q, the relative position between the metal piece 11 and the grounded conductive wall 10b and the amount of the positive electric charge Q.

Figure 4:
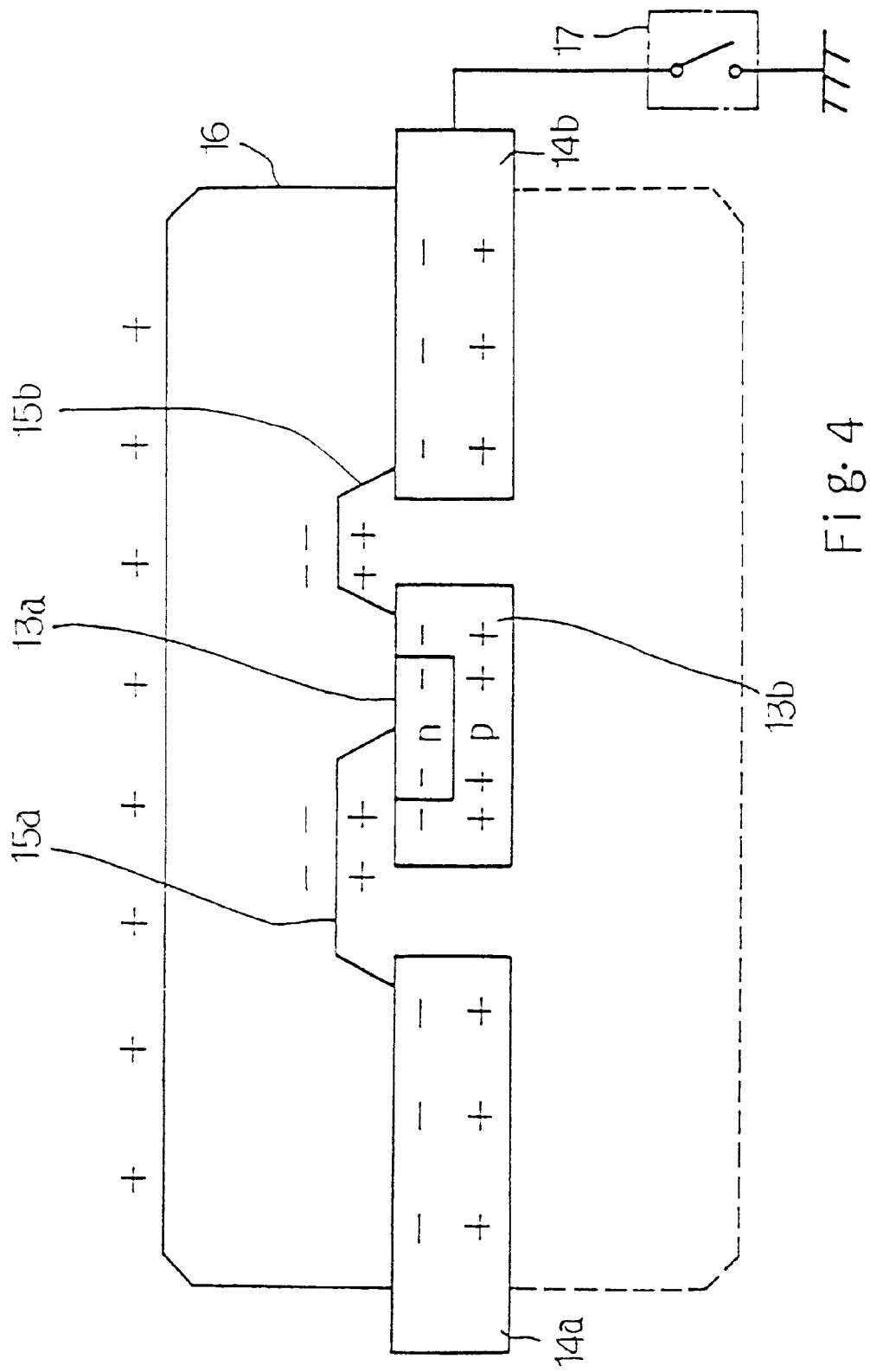
FIG. 4 is a schematic view showing a destruction due to the movable charge.

Subsequently, description is made on a destruction due to the movable charge flowing out from a large scale integrated circuit device with a charged package with reference to FIG. 4. The large scale integrated circuit device includes a p-n junction between an n-type region 13a and a p-type region 13b, conductive leads 14a and 14b respectively connected through metal wirings 15a and 15b to the n-type region 13a and the p-type region 13b and a plastic package 16 sealing the p-n junction, the metal wirings 15a and 15b and parts of the conductive leads 14a and 14b. Although only one p-n junction is illustrated, a large number of p-n junctions are incorporated in the large scale integrated circuit device.

The plastic package 16 is charged due to the friction or the discharge, and positive electric charge is dispersed over the surface of the plastic package 16. The positive electric charge in the surface of the plastic package 16 directly and indirectly induces negative electric charge and positive electric charge in the surfaces of the conductive leads 14a and 14b, the metal wirings 15a and 15b, the n-type region 13a and the p-type region 13b as shown. Initially, the conductive leads 14a and 14b, the metal wirings 15a and 15b and the p-n junction are equal in potential level.

Assuming now that a spark discharge or a contact discharge 17 takes place at the conductive lead 14a so as to decrease the conductive lead 14a to the ground voltage level, all of the movable charge rapidly flows toward the ground, and the velocity is depending upon the distributed parameters of the related circuit. Even though the p-n junction is broken down, the p-n junction still have a potential barrier higher than the conductive leads 14a and 14b and the metal wirings 15a and 15b, a potential difference is produced between the conductive leads 14a and 14b or across the p-n junction until all of the movable charge flows out. If the movable charge passes through a junction type microstructure, the movable charge leaves thermo-energy, and the electrostatic destruction takes place at the micro-structure. On the other hand, a MOS type micro-structure is destroyed by the electric field created by the movable charge per se.

The movable charge is inducted by the positive electric charge accumulated in the surface of the plastic package, and the measuring apparatus according to the present invention converts the movable charge flowing out from the lead 14b to potential level or current. Then, the measuring apparatus measures the potential level or the current. If the potential level is known, the amount of electric charge accumulated in the micro-structure is calculated by using Equation 1. Thus, the measuring apparatus according to the present invention includes a probe connectable to a conductive part of a sample, an accumulating unit for converting the movable charge to a potential level and an electric measuring unit for measuring the potential level. The movable electric charge may be measured as an electric current.

However, following circumstances are taken into account in the estimation.

First, the amount of the movable charge is variable together with the relative relation between the charged package and the ground, and, for this reason, an analysis should be carried out on the basis of the movable charge measured in the same circumstances as those in the fabrication process. This means that the measuring apparatus according to the present invention is expected to be portable.

Second, the electric charge is not uniformly dispersed over the surface of the insulating package, and the amount of induced charge is considered to be different between the leads. For this reason, the measuring apparatus according to the present invention should directly measure the movable charge flowing out from each of the leads. In this aspect, the measuring apparatus disclosed in the aforesaid Japanese Patent Publication of Unexamined Application is not suitable for the large scale integrated circuit device, because the self-discharge type charge eliminator 6 is implemented by a brush-like electrode connectable to an entire surface of the charged package.

Third, the accumulating unit incorporated in the measuring apparatus according to the present invention is expected to be much smaller in impedance or the inverse of the capacitance than the charged package as if the impedance is zero. In detail, although the electrostatic charge is high in the potential level, the amount of the electrostatic charge is small. For example, if the capacitance of the sample 9 is 1 pF and the amount of electric charge Q1 is 10 nC, a potential level V1 with respect to the ground is given as $$V_1 = Q_1/C_1 = 10 \times 10^{-9}/1 \times 10^{-12} (C/F) = 10,000 \text{ volt} \quad \text{Equation 2}$$

For this reason, the accumulating unit incorporated in the measuring apparatus according to the present invention is designed to be available for a high potential small change charge sample. If the impedance of the accumulating unit is not seemed to be zero, all the amount of electric charge is not led to the accumulating unit, and part of the electric charge is left in the sample. This means that the measured amount is not reliable.

Fourth, if the electric measuring unit incorporated in the measuring apparatus according to the present invention is implemented by a peak volt meter, the electric measuring unit is expected to be large in input impedance and withstand voltage. If the input impedance is small, the movable charge partly flows into the electric measuring unit, and the measuring accuracy is lowered.

Finally, if the probe is connected through a wiring to the accumulating unit, an influence of external electro-magnetic wave and a piezo effect are taken into account. If a bare wire is used, the external electromagnetic wave induces a noise to the bare wire. On the other hand, if a coaxial cable is used, the coaxial cable moved in the measuring work varies the potential level due to the piezo effect.

DESCRIPTION OF THE PREFERRED EMBODIMENTS

First Embodiment

Figure 5:
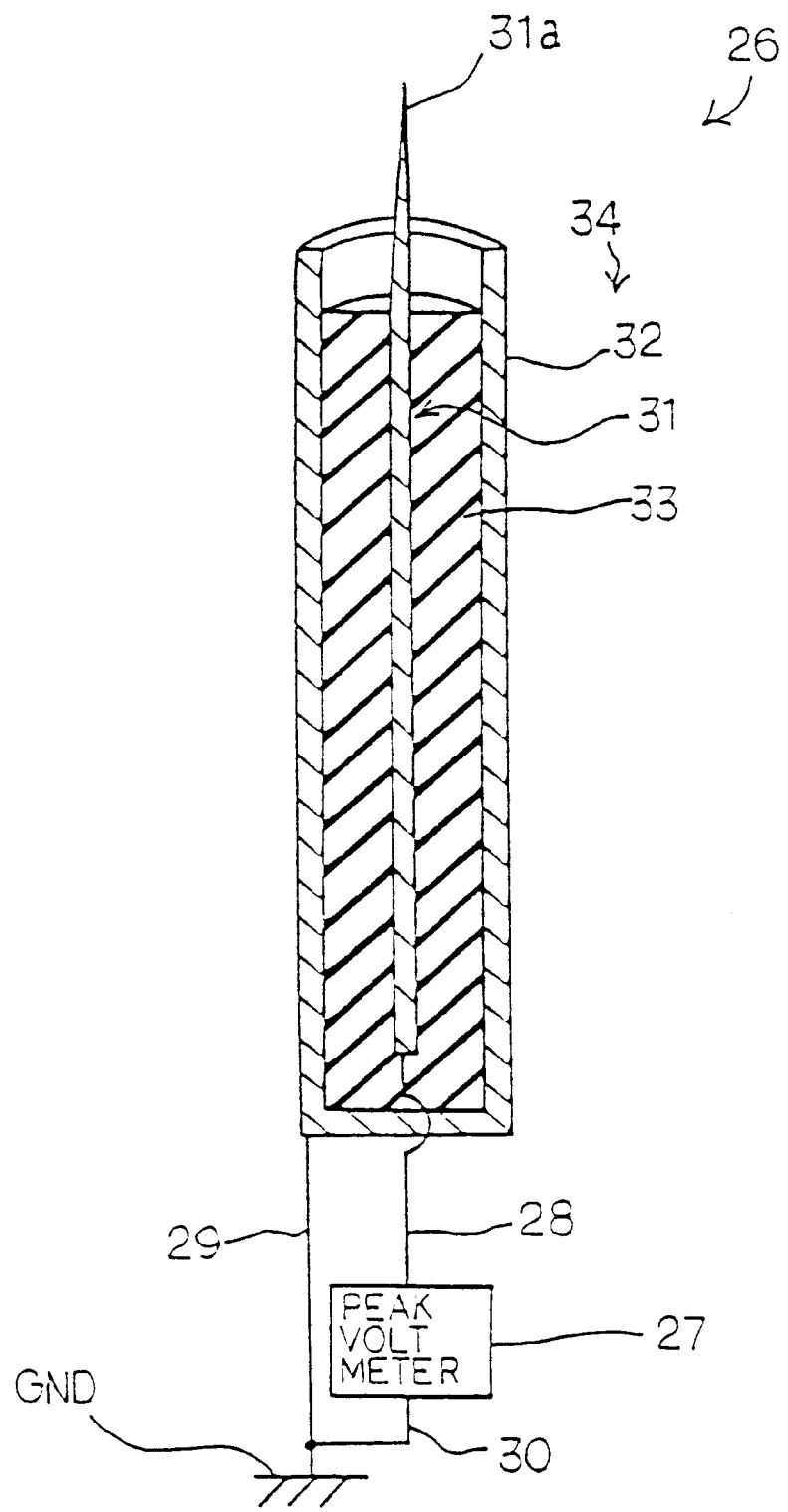
FIG. 5 is a cross sectional perspective view showing a measuring apparatus according to the present invention.

Referring to FIG. 5 of the drawings, a measuring apparatus embodying the present invention largely comprises a measuring tool 26, a peak volt meter 27 and flexible wiring members 28, 29 and 30 connected between the measuring tool 26, the peak volt meter 27 and the wiring members 28, 29 and 30. The measuring tool 26 is similar to a pencil, and is, accordingly, handy. An analyst can carry the measuring apparatus to a large scale integrated circuit device in a fabricating/conveying/testing apparatus, and brings the measuring tool 26 to leads of the large scale integrated circuit device.

The measuring tool 26 comprises a needle member 31 connected through the wiring member 28 to the peak volt meter 27, an outer cylindrical case member 32 electrically connected through the wiring member 29 to a ground voltage source GND and an insulating member 33 inserted between the needle member 31 and the outer cylindrical case member 32. The peak volt meter 27 is electrically connected through the wiring member 30 to the ground voltage source GND.

The needle member 31 has a sharp leading end 31a, and the sharp leading end 31a can approach each of the leads of the large scale integrated circuit device. The sharp leading end 31a projects from the insulating member 33, and the remaining part of the needle member 31 is embedded in the insulating member 33. In this instance, the needle member 31 is 150 millimeters in length, and is formed of a conductive stainless steel. The needle member 31 is so rigid that the amount of movable charge measured with the measuring tool 26 is free from influences of a deformation of the needle member 31.

The outer cylindrical case member 32 is also formed of the conductive stainless steel, and is 20 millimeters in diameter. Thus, the measuring tool 26 is surely handy. The outer cylindrical case member 32 grounded through the wiring member 29 further serves as a shield against electromagnetic wave.

The insulating member 33 is formed of ceramic material having the dielectric constant of 8.5, and is 0.05 millimeter in thickness. The ceramic material is large in mechanical strength. However, the outer cylindrical case member 32 provides sufficient rigidity in this instance, and the insulating member 33 may be formed of resilient insulating material or plastic material.

The needle member 31, the insulating layer 33 and the outer cylindrical member 32 serve in combination as a capacitor 34, and the sharp leading end of the needle member 31 serves as a probe. The capacitance between the needle member 31 and the outer cylindrical member 32 is about 1000 pF, and is hundreds times larger than a capacitance of each lead of a large scale integrated circuit device of the order of several pF. Even when the insulating package is strongly charged, the movable charge of each lead is of the order of several nC. For this reason, the impedance of the capacitor unit 34 is ignoreable, and the amount of remaining movable charge left in the lead is ignoreable by virtue of the ignoreable impedance.

In this instance, the capacitor unit 34 is assumed to have a distributed capacitance from a contact point between the sharp leading end 31a to the opposite end of the needle member 31. When the movable electric charge is flowing into the needle member 31, the transfer from the lead to the needle member 31 is completed within pico-seconds. However, the capacitor unit 34 is gradually charged from a closer point to the sharp leading end 31a toward the opposite end due to the time constant variable with the distance from the sharp leading end 31a. For this reason, even if the potential level at the lead is extremely high, the extremely high potential level is not immediately propagated to the peak volt meter 27, and the peak volt meter 27 is hardly destroyed nor leaks the movable electric charge to the ground voltage source GND. This means that all of the movable electric charge is accumulated in the capacitor unit 34. For example, if the capacitance of the lead and the amount of movable charge are 1 pF and 10 nC, the lead is charged at 10,000 volts. If the distributed capacitance is not created in the capacitor unit 34, 10,000 volts is directly applied to the voltage meter 27, and part of the movable charge determined by the applied voltage and the internal resistance of the peak volt meter 27 is discharged to the ground voltage source GND. The part of the movable electric charge discharged to the ground voltage source makes the measurement not reliable. However, the capacitor unit 34 forms the distributed capacitance, and the volt member 27 incorporated in the measuring apparatus is free from these problems.

Figure 6A:
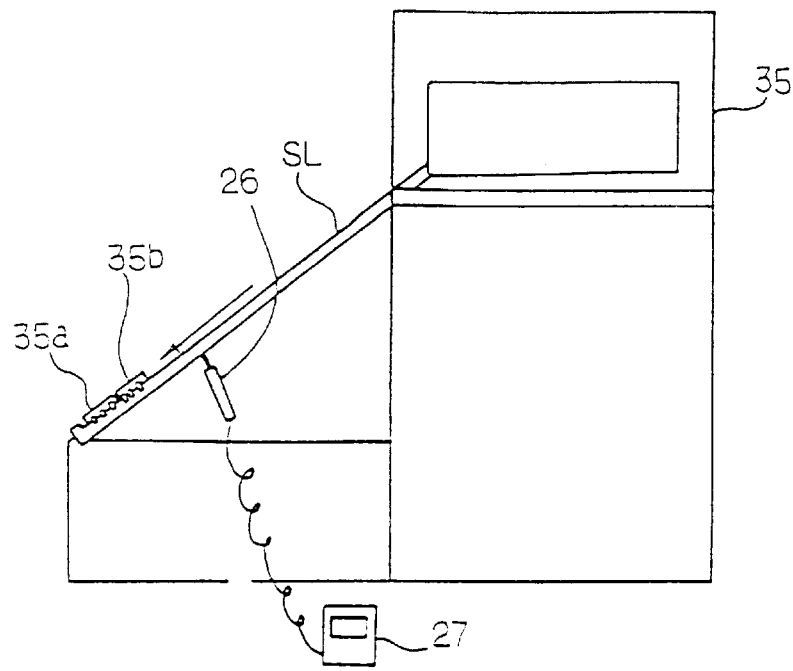
FIG. 6A is a schematic view showing a measurement of the amount of movable charge by using the measuring apparatus according to the present invention.
Figure 6B:
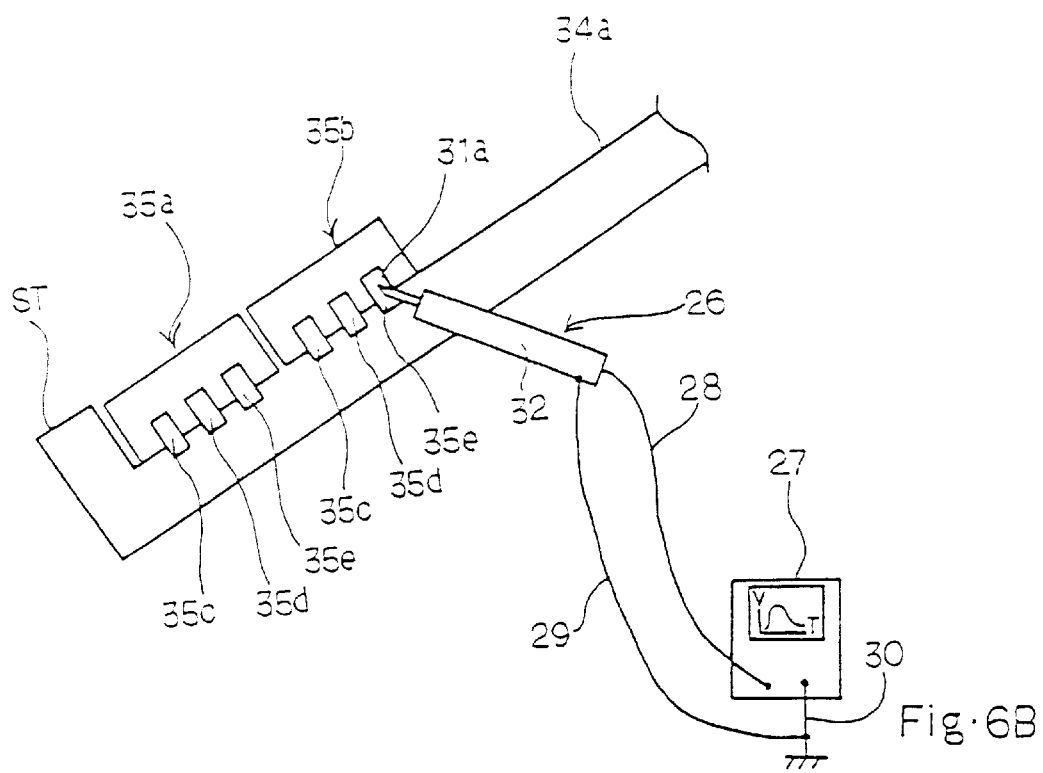
FIG. 6B is a view showing a part of FIG. 6A in a large scale.

Description is hereinbelow made on a measuring method using the measuring apparatus according to the present invention with reference to FIGS. 6A and 6B.

Reference numeral 35 designates an apparatus used in the fabrication process for the large scale integrated circuit device, and a metal rail SL provides a sloop for an outlet from the apparatus 34. Large scale integrated circuit devices 35a and 35b slide along the metal rail SL, and are terminated at a stopper ST.

While the large scale integrated circuit device 35b is, by way of example, sliding on the metal rail SL, the insulating package is charged with positive electric charge, and the positive electric charge induces fixed negative electric charge and positive movable electric charge in each of leads 35c, 35d and 35e projecting from the insulating package.

An analyst is assumed to measure the amount of the movable charge induced in each of the leads 35c, 35d and 35e. The analyst brings the measuring apparatus shown in resistive element integral with the needle member 31 and the insulating member 33 may be electrically provided between the sharp end portion and the middle portion.

Figure 9A:
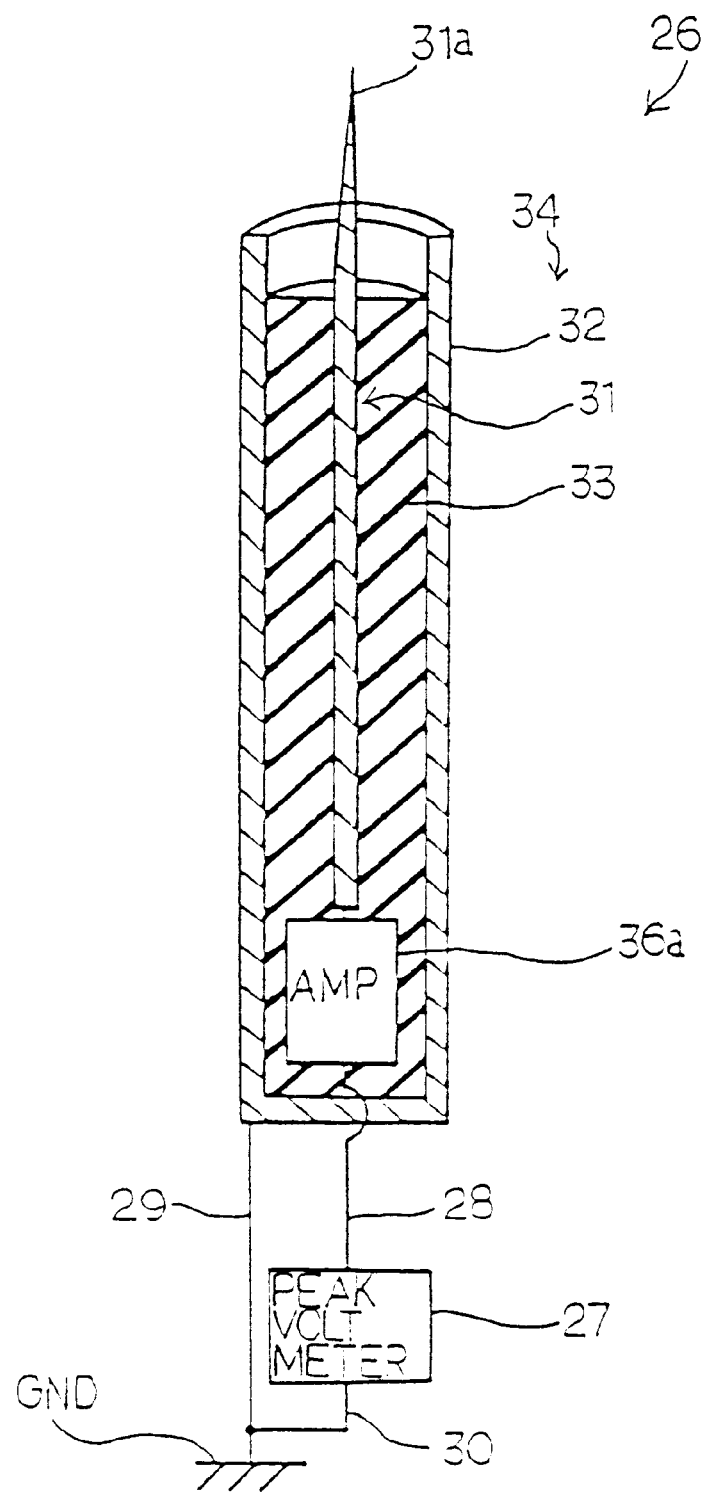
FIGS. 9A and 9B are cross sectional perspective views showing other modifications of the measuring apparatus according to the present invention.
Figure 9B:
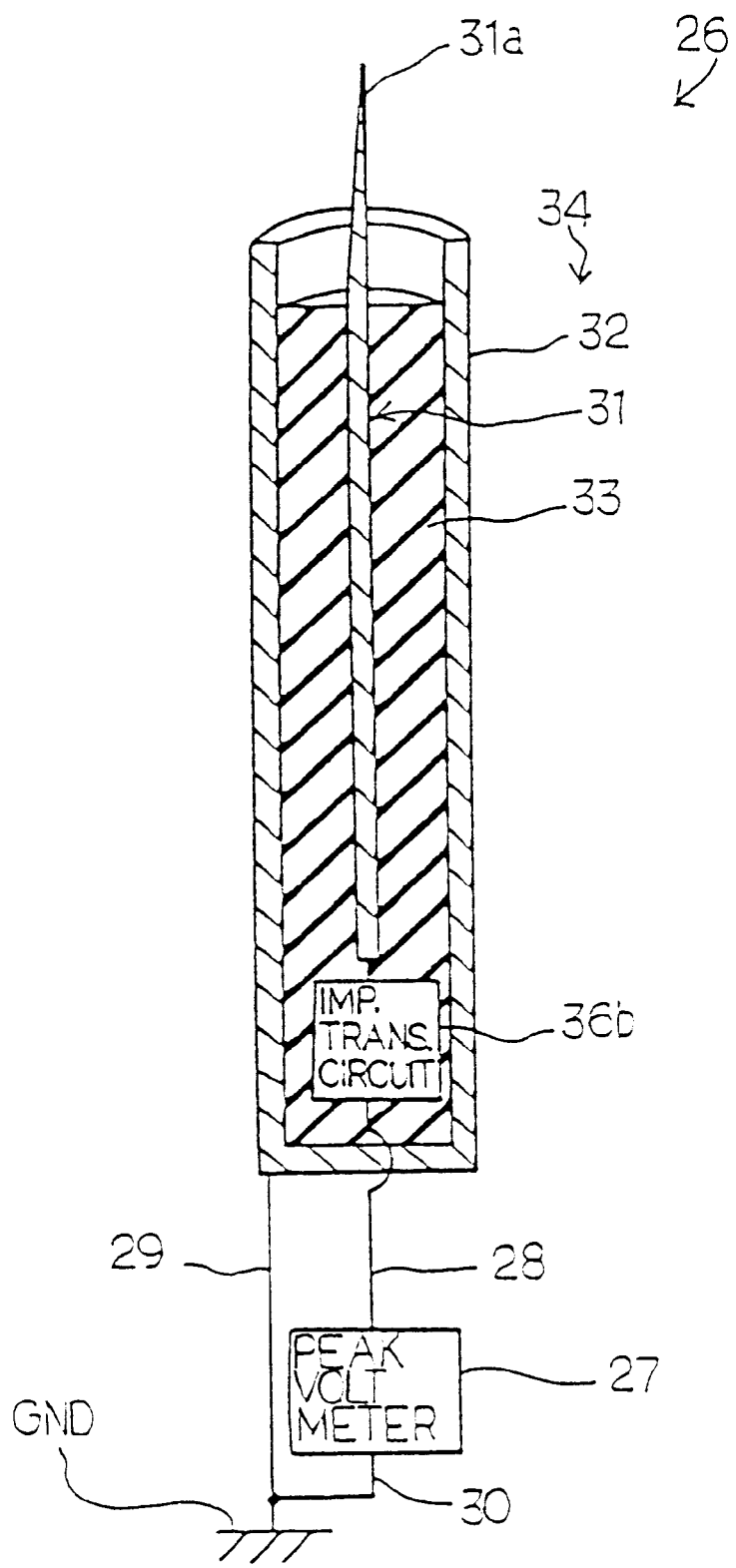

FIGS. 9A and 9B illustrate fourth and fifth modifications, respectively. The fourth modification further comprises an amplifier 36a coupled between the needle member 31 and the wiring 28, and the amplifier 36a converts a high input impedance to a low impedance. The amplifier circuit 36a is accommodated in the space of the outer cylindrical case member 32, and is fixed by means of the insulating member 33. The amplifier 36a eliminates influences of an electromagnetic induction and influences of a deformation of the wiring 28 from the potential level measured by the peak volt meter 27. Thus, the amplifier 36a enhances the accuracy of the measured potential level.

An impedance transformation circuit 36b is also available as shown in FIG. 9B.

Figure 10:
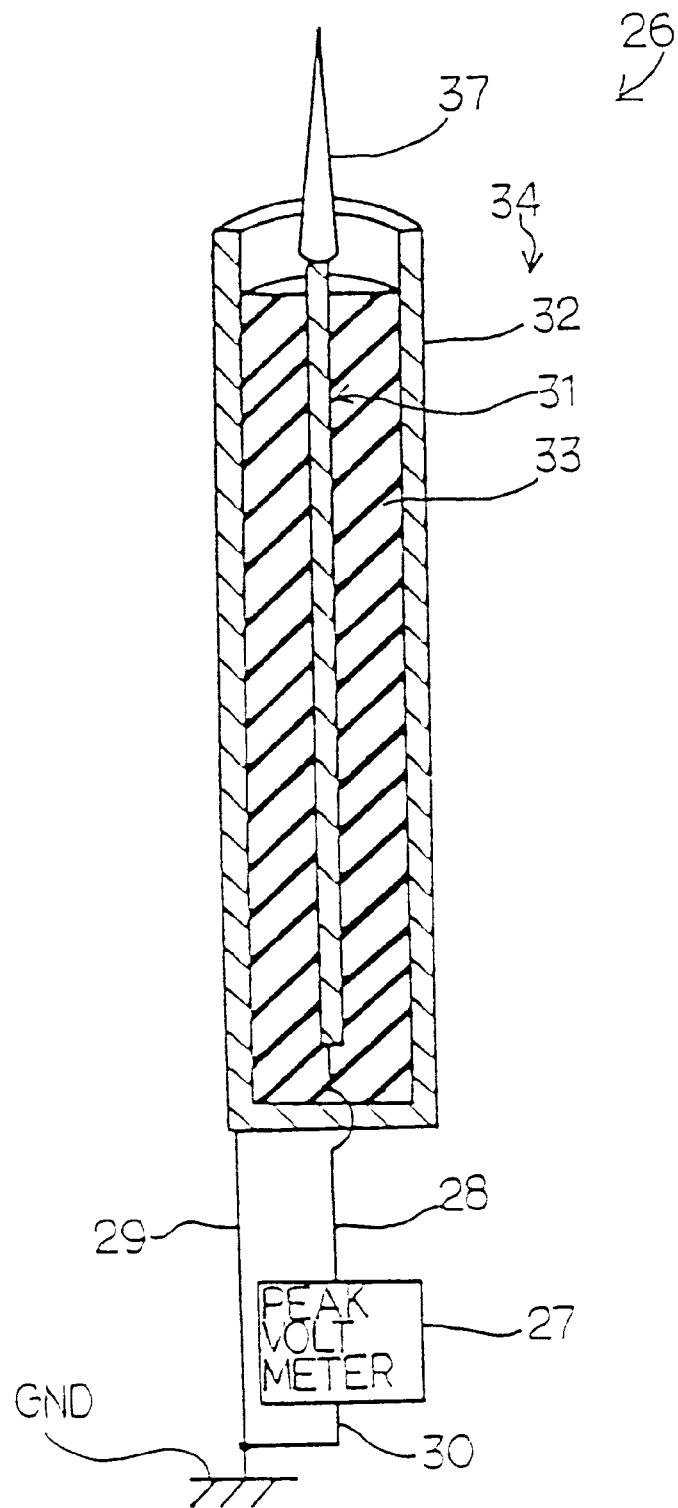
FIG. 10 is a cross sectional perspective view showing another modification of the measuring apparatus according to the present invention.

FIG. 10 illustrates a sixth modification, and an elastic probe 37 is fixed to an leading end of the needle member 31. The elastic probe 37 is, by way of example, formed of phosphor bronze or carbon-containing conductive rubber.

Figure 11:
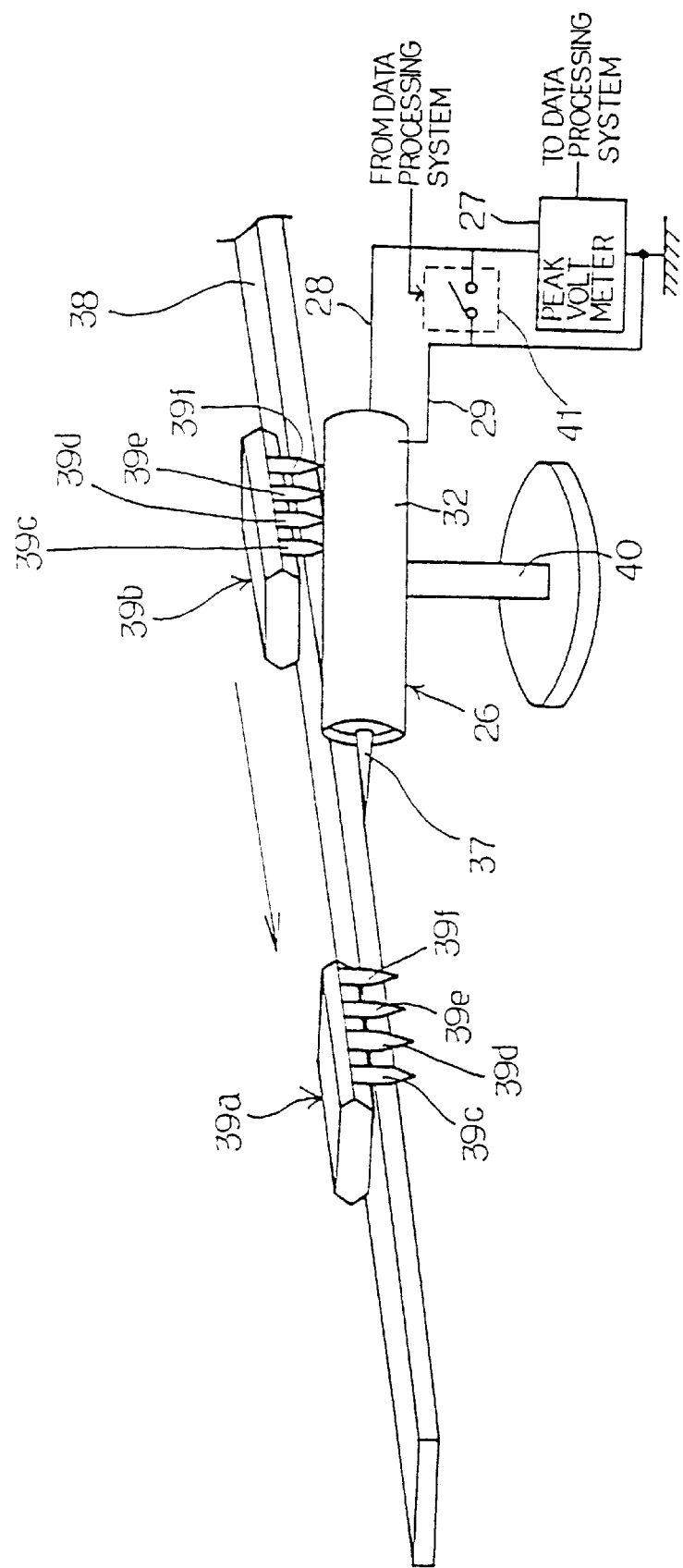
FIG. 11 is a perspective view showing the modification used in an automatic measurement.

The elastic probe 37 is desirable for an automatic successive measurement as shown in FIG. 11. In detail, FIG. 5 to the metal rail SL, and the outer cylindrical case member 32 and the peak volt meter 27 are grounded through the wiring members 29 and 30.

The needle member 31 is short circuited with the outer cylindrical case member 32, and the potential level at the needle member 31 is read by the analyst.

Thereafter, the sharp leading end 31a is brought in contact with the lead 35e. Then, the movable electric charge is transferred from the lead 35e to the needle member 31 through spark and contact discharging phenomena, and is accumulated in the capacitor unit 34.

The movable charge accumulated in the capacitor unit 34 changes the potential level at the needle member 31, and the largest potential difference V from the initial value is read by the analyst. The movable charge is gradually discharged from the capacitor 34, and the peak volt meter 27 holds the largest potential difference V. The capacitance C of the capacitor unit 34 has been already known, and the amount of movable charge Q is calculated by using the equation Q=C×V.

Figure 7A:
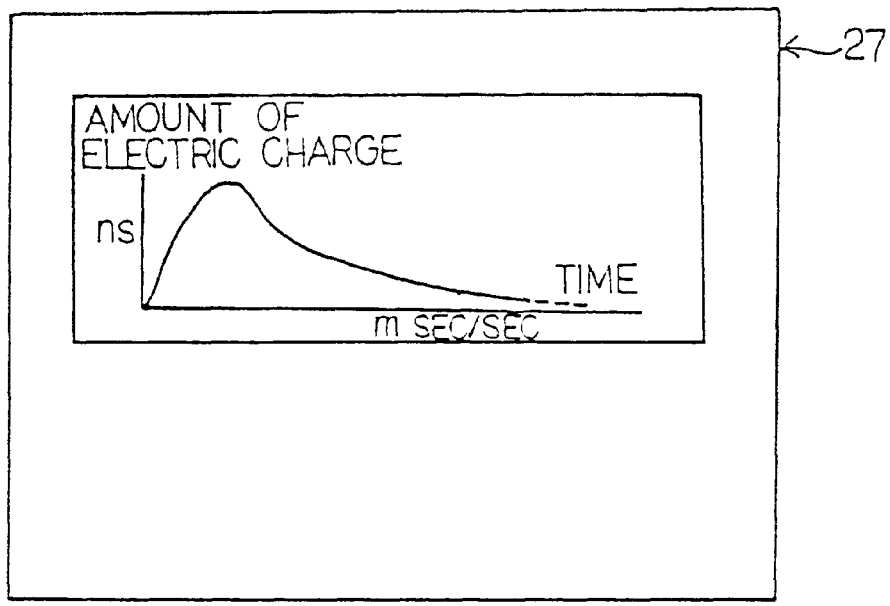
FIGS. 7A and 7B are front views showing various scales for a peak volt meter.
Figure 7B:
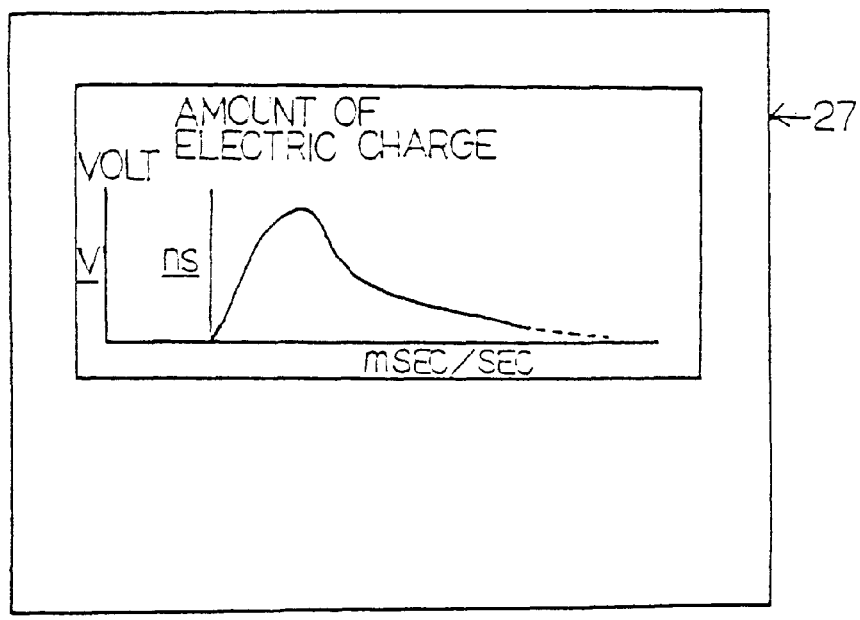

In this instance, the amount of movable charge is calculated by the analyst. However, the scale of the peak volt meter 27 may be changed to directly indicate the amount of movable electric charge, because the relation between the potential difference and the amount of movable charge is known. If the scale is indicative of the amount of electric charge, the indicator window may be as shown in FIG. 7A. FIG. 7B shows an indicator window for both of the potential level and the amount of electric charge.

As will be appreciated from the foregoing description, the measuring apparatus according to the present invention accumulates the movable electric charge from each of the leads into the capacitor unit, and determines the amount of the movable electric charge on the basis of the potential difference of the capacitor unit. As a result, the analyst can exactly analyze the break-down phenomenon of the microstructure of the large scale integrated circuit device on the basis of the results of the measurement.

The measuring apparatus according to the present invention is modified as follows.

Figure 8A:
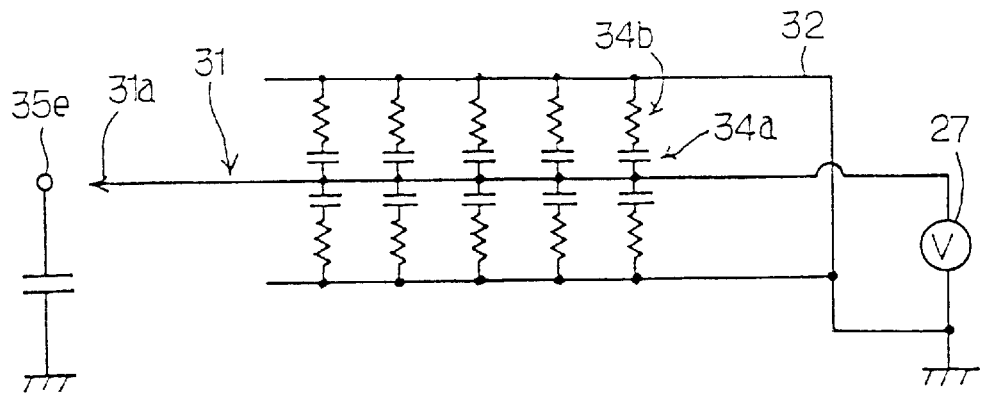
FIGS. 8A to 8C are circuit diagrams showing modifications of the measuring apparatus according to the present invention.

The capacitor unit 34 is replaced with a plurality of micro-capacitors 34a connected in parallel as shown in FIG. 8A, and the plurality of micro-capacitors 34a are arranged as in a concentrated constant. It is desirable to insert resistor elements 34b between the micro-capacitors 34a and the outer cylindrical case member 32, because the resistors 34b makes differences between the time constants respectively coupled to the micro-capacitors 34a clear. Alternatively, the resistance of the needle member 31 is designed to be gradually and clearly increased along the propagation path of the movable electric charge instead of the resistors 34b.

Figure 8B:
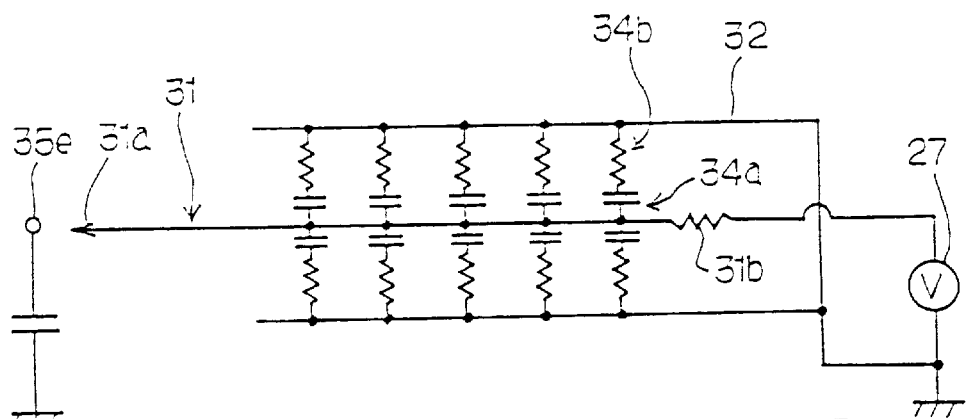

The second modification is shown in FIG. 8B, and a resistor 31b prevents the volt member 27 from an excessively high potential level. The resistor 31b is effective against leakage current through the peak volt meter 27 due to the excessively high potential level. The resistor 31b may be implemented by the opposite end portion of the needle member 31 increased in resistance rather than the sharp leading end portion and an intermediate portion coupled to the micro-capacitors 34a. Alternatively, a resistive element may be electrically connected between the opposite end and the wiring 28.

Figure 8C:
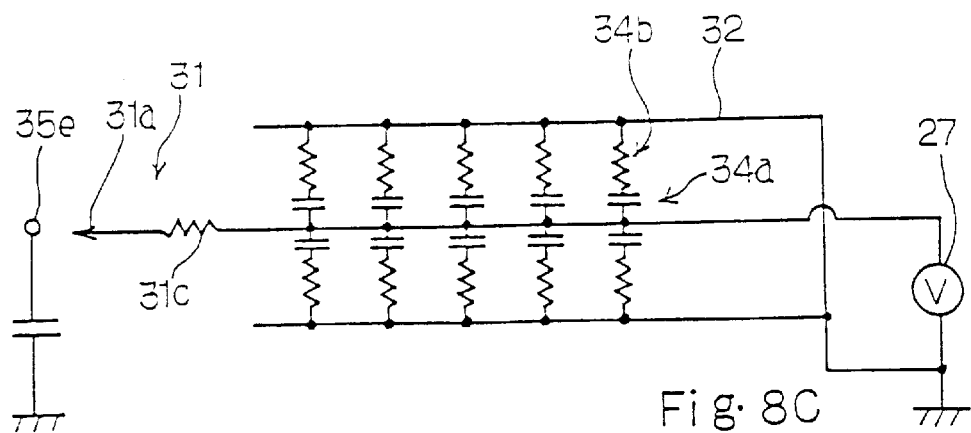

The third modification is featured by a resistor 31c as shown in FIG. 8C, and the resistor 31c serves as similar to the resistor 31b. The resistor 31c may be implemented by the sharp leading end portion of the needle member 31 increased in resistance rather than the opposite end portion and the intermediate portion. Alternatively, a the measuring apparatus is placed beside a sliding rail 38 where large scale integrated circuit devices 39a and 39b successively pass. A bracket 40 supports the measuring tool 26, and a cancel switch 41 is connected between the wiring members 28 and 29. The cancel switch 41 and the peak volt meter 27 may be connected to a data processing system (not shown).

While the large scale integrated circuit devices 39a and 39b are successively sliding on the rail 38, the leads 39c, 39d, 39e and 39f of the large scale integrated circuit device are intermittingly brought into contact with the elastic probe 37, and the elastic probe 37 is deformed so that the leads 39c/39d/39e/39f escape from the elastic probe 37. The movable charge are intermittently discharged from the respective leads 39c to 39f to the elastic prove 37, and a data signal indicative of the potential data is fetched by the data processing system at intervals. After the data fetch, the data processing system controls the cansel switch 41, and short circuits the conductive needle member 31 and the conductive outer cylindrical case member 32. Thus, the measuring apparatus shown in FIG. 11 automatically measures the amount of movable electric charge induced in each of the leads 39c to 39f.

Figure 12:
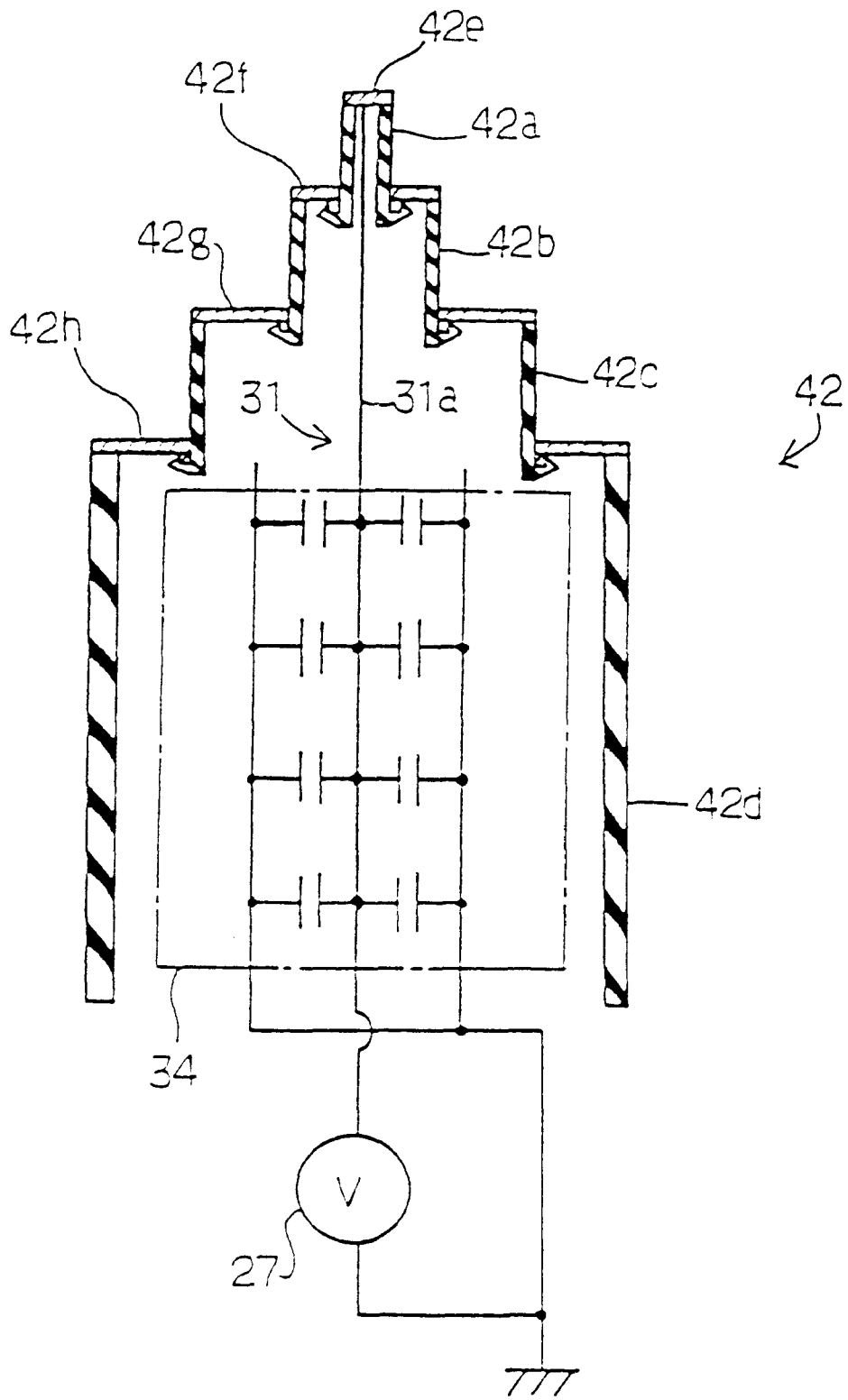
FIG. 12 is a cross sectional view showing yet another modification of the measuring apparatus according to the present invention.

FIG. 12 illustrates a seventh modification of the measuring apparatus according to the present invention, and the capacitor unit 34 is housed in a retractable outer case 42. The retractable outer case 42 comprises a plurality of insulating coaxial tubes 42a, 42b, 42c and 42d different in diameter, a conductive circular plate attached to the smallest coaxial tube 42a and a plurality of ring-shaped conductive plates 42f, 42g and 42h attached to the insulating coaxial tubes 42b to 42d, respectively. The inner coaxial tubes 42a to 42c are projectable from the ring-shaped conductive plates 42f to 42h, resepctively. Since the insulating coaxial tubes 42a to 42c are snugly inserted into the ring-shaped coductive plates 42f to 42h, and the ring-shaped conductive plates 42f to 42h can hold the insulating coaxial tubes 42a to 42c at an arbitrary position.

The handy measuring tool shown in FIG. 12 changes the contact area with a sample by rectacting and projecting the coaxial tubes 42a to 42c. If a sample requires the narrowest contact area, an analist projects the coaxial tubes 42a to 42c from the ring-shaped conductive plates 42f to 42h, and the circular conductive plate 42e is electrically isolated from the ring-shaped coductive paltes 42f to 42h. In this situation, electric charge is discharged from the sample through the circular coductive palte 42e to the capacitor 34.

On the other hand, if a sample requires the widest contact area, the coaxial tubes 42a to 42c are retracted into the insulating tube 42d, and the circular conductive plate 42e is electrically connected to the ring-shaped coductive plates 42f to 42h. Then, electric charge of the sample is discharged through the widest contact area to the capacitor unit 34.

Each of the fourth to seventh modifications may have a capacitor illustrated in one of FIGS. 8A to 8C.

Although the description is made on the measurement of the amount of the movable charge induced in the coductive lead, the measuring apparatus shown in FIGS. 5, 9A, 9B and 10 are avialble for electric charge dispersed in a wide area, and the handy measuring tool enhances the measuring accuracy by virtue of the succesive accumulation of the capacitor unit 34. If a wire brush type charge eliminator or a conductive roller type charge eliminator is attached to the needle member 31, the electric charge dispersed in a wide area is easily gathered into the capacitor unit 34.

Second Embodiment

Figure 13:
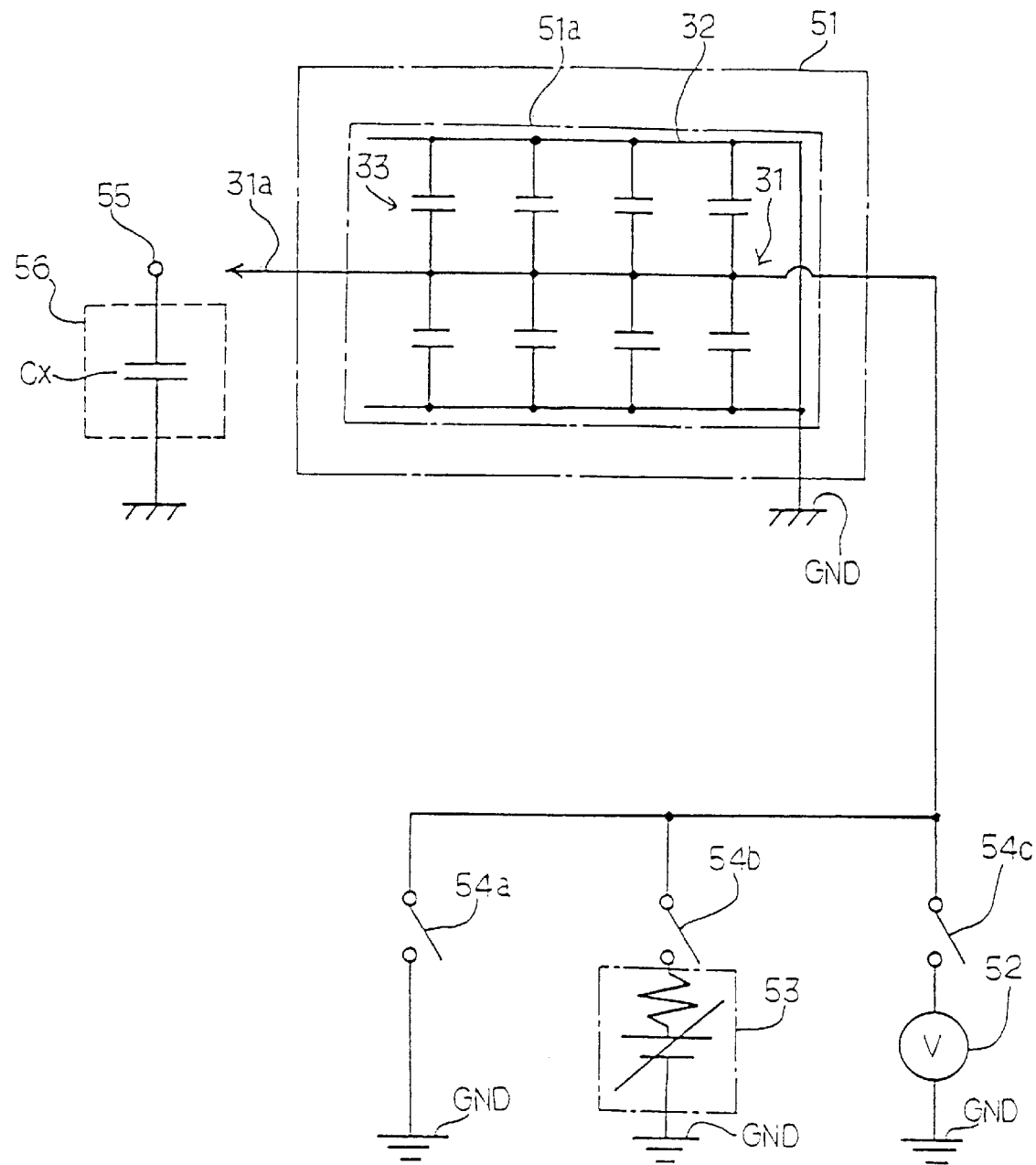
FIG. 13 is a circuit diagram showing the circuit arrangement of another measuring apparatus according to the present invention.

Turning to FIG. 13 of the drawings, another measuring apparatus embodying the present invention largely comprises a measuring tool 51, a peak voltage meter 52, a direct current source 53 and switching units 54a, 54b and 54c coupled between the measuring tool 51 and a ground terminal/the direct current source 53/peak volt meter 52.

The measuring tool 51 has a capacitor unit 51a similar in structure to the capacitor unit 34, and component members of the capacitor 51a are labeled with the same references as those of the capacitor 34 without detailed description. The capacitor unit 51a may be similar to one of the capacitors shown in FIGS. 8A to 8C.

Moreover, the measuring tool 51 may be associated with the protectable/retractable case shown in FIG. 12.

The measuring apparatus shown in FIG. 13 is available for measuring a capacitance Cx of a lead terminal 55 and electrostatic energy accumulated in the lead terminal 55 as follows.

First, the switching unit 54a is closed, and electric charge accumulated in the needle member 31 is discharged through the switching unit 54a to the ground terminal. Thereafter, the switching unit 54a is opened so as to isolate the needle member 51 from the ground.

Subsequently, the sharp leading end 31a is brought into contact with the lead terminal 55, and the switching unit 54c is closed. The potential level Vm of the needle member 31 is measured by the peak voltage meter 52. The amount of movable charge QL1 induced by a charged insulating package 56 is given by using Equation 2.

$$QL1 = Cp \times Vm \qquad \text{Equation 2}$$

where Cp is the capacitance of the capacitor unit 51a.

Subsequently, the switching unit 54b is closed, and a potential V is applied through the needle member 31 to the lead terminal 55. Then, the switching unit 54b is opened, and the sharp leading end 31a is spaced from the lead terminal 55.

The needle member 31 is grounded through the switching unit 54a, and the sharp leading end 31a is brought into contact with the lead terminal 66. The switching unit 54c is closed again, and the amount of electric charge QL2 accumulated in the lead terminal 55 is determined. Then, the capacitance CL of the lead terminal with respect to the ground is given by Equation 3.

$$CL = QL2/V \qquad \text{Equation 3}$$

Finally, the electrostatic energy E in the presence of the charged insulating package 56 is given by Equation 4.

$$E = (1/2) \times (QL1^2)/CL \qquad \text{Equation 4}$$

Thus, the electrostatic energy E is given as in the same circumstances as the fabrication process, and an analyst can judge whether the circumstances should be improved or not.

Since the direct current source 53 is a variable power source, the analyst can confirm the critical electric charge and, accordingly, the critical electrostatic energy by increasing the potential level applied to the lead terminal 55.

The measuring apparatus implementing the second embodiment can be modified as similar to those of the first embodiment.

Third Embodiment

Figure 14:
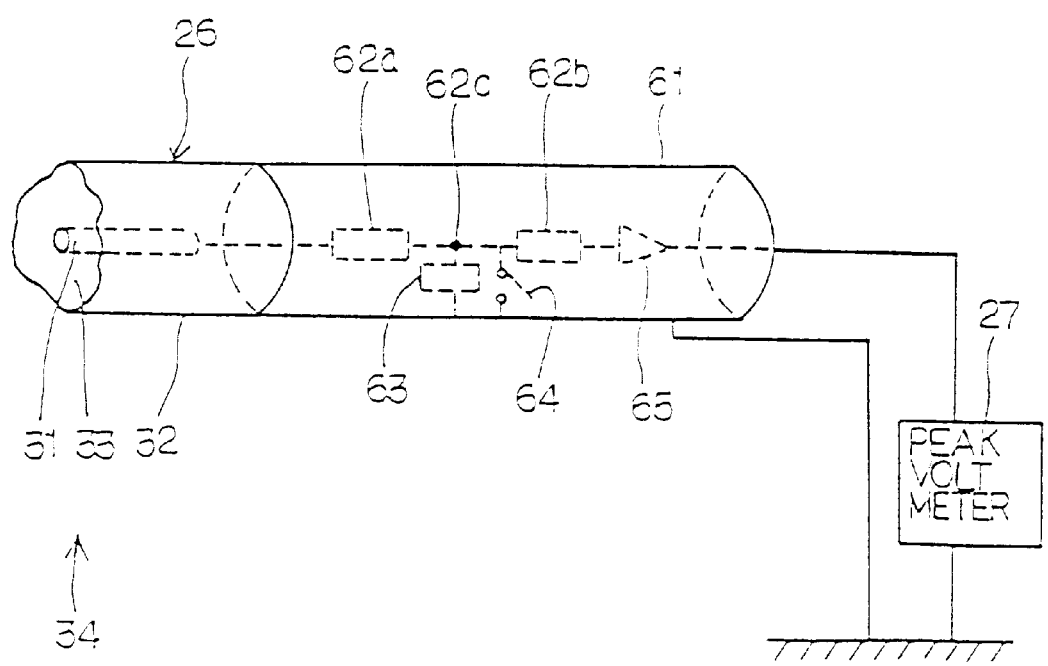
FIG. 14 is a perspective view showing an additional feature of a measuring apparatus according to the present invention.

FIG. 14 illustrates yet another measuring apparatus embodying the present invention. The measuring tool 26 and the peak volt meter 27 are similar to those of the first embodiment. The measuring apparatus further comprises a conductive tubular member 61 connected to the ground, a resistor 62a connected to the needle member 31, a resistor 62b connected in series to the resistor 62a through a node 62c, a capacitor connected between the node 62c and the conductive tubular member 61, an initialization switch 64 coupled between the node 62c and the conductive tubular member 61 and an amplifier connected at an input node thereof to the resistor 62b and at the output node thereof to the peak volt meter 27. The resistors 62a and 62b, the capacitor 63, the switch 64 and the amplifier 65 are provided in an inner space of the conductive tubular member 61, and the conductive tubular member protects these circuit components 62a, 62b, 63, 64 and 65 from undesirable destruction. The resistor 62a ranges from 10 kilo-ohms to 100 mega-ohms, and the resistor 62b ranges between 10 kilo-ohms and 1 mega-ohm. The movable electric charge is slowly guided to the amplifier 65, and the amplifier 65 transfers the amount of movable electric charge to the peak volt meter 27. The peak value takes place after several millisecond to several seconds depending upon the input impedance of the amplifier 65.

Although particular embodiments of the present invention have been shown and described, it will be obvious to those skilled in the art that various changes and modifications may be made without departing from the spirit and scope of the present invention.

For example, the measuring apparatus and the method according to the present invention is available for any kind of charged sample, and the application is not limited to the large scale integrated circuit device.

In the above embodiments, the needle member is connected to the peak volt meter. However, a sample-and-hold circuit may be connected to the needle member, and an appropriate data processor may display the peak value supplied from the sample-and-hold circuit on a display as a digital code.

What is claimed is:

1. A method of measuring the amount of an electric charge from an IC, comprising:

a) preparing a sample including a charged insulating part and a conductive part having a fixed electric charge and a movable electric charge opposite in polarity to said fixed electric charge, both of said fixed electric charge and said movable electric charge are in said conductive part in the presence of said charge insulating part;

b) accumulating said movable electric charge from a conductive lead of said IC into a capacitor means for changing a potential level from an initial value to a final value by contacting said conductive lead of said IC to the capacitor means;

c) measuring a difference between said initial value and said final value; and d) calculating the amount of said movable electric charge on the basis of a capacitance of said capacitor means and said difference.

2. The method as set forth in claim 1, wherein said conductive lead is one of a plurality of conductive leads and each conductive lead is electrically isolated from one another and having movable electric charges for each respective conductive lead, and said steps b) to d) are repeated for measuring said movable electric charges for each respective lead.

3. The method as set forth in claim 2, in which said sample is moved so that said plurality of conductive leads intermittently discharge said movable electric charges from each respective conductive lead to said capacitor means.

4. The method as set forth in claim 2, further comprising the steps of e) discharging said movable electric charge from said capacitor means;

f) charging said plurality of conductive leads to a known potential level;

g) accumulating an electric charge from said plurality of conductive leads into said capacitor means for changing the potential level to another final value;

h) determining the amount of said electric charge;

i) determining a capacitance of said plurality of conductive leads with respect to a constant voltage source, and j) determining an electrostatic energy on the basis of said capacitance of said plurality of conductive leads and said amount of said movable electric charge.

5. The method as set forth in claim 4, in which said electrostatic energy is calculated as $E=(½) \times Q^2/CL$ where E is said electrostatic energy, Q is said amount of said movable electric charge and CL is said capacitance of said conductive part.

* * * * *